United States Patent
Yang

(10) Patent No.: US 7,952,157 B2
(45) Date of Patent: May 31, 2011

(54) ELECTROMAGNETIC SHIELDING DEVICE FOR AN INFRARED RECEIVER

(76) Inventor: Jiaxiang Yang, Harbin (CN)

(*) Notice: Subject to any disclaimer, the term of this patent is extended or adjusted under 35 U.S.C. 154(b) by 393 days.

(21) Appl. No.: 12/093,204

(22) PCT Filed: Nov. 20, 2006

(86) PCT No.: PCT/CN2006/003120
§ 371 (c)(1),
(2), (4) Date: May 9, 2008

(87) PCT Pub. No.: WO2007/059700
PCT Pub. Date: May 31, 2007

(65) Prior Publication Data
US 2008/0283976 A1 Nov. 20, 2008

(30) Foreign Application Priority Data

Nov. 25, 2005 (CN) ............... 2005 2 0022019 U
Feb. 13, 2006 (CN) ............... 2006 2 0020197 U

(51) Int. Cl.
*H01L 27/146* (2006.01)
(52) U.S. Cl. ........ 257/435; 257/432; 257/433; 257/434; 257/659; 257/E23.001; 257/E23.004
(58) Field of Classification Search .............. 257/432, 257/433, 434, 435, E23.001, 4
See application file for complete search history.

(56) References Cited

U.S. PATENT DOCUMENTS 7,244,922 B2 * 7/2007 Honboh .............. 250/214 R
2006/0220238 A1 10/2006 Kim

FOREIGN PATENT DOCUMENTS

| CN | 2610574 Y | 4/2004 |
| CN | 1662129 A | 8/2005 |
| JP | 8222746 A | 8/1996 |
| JP | 2000252680 A | 9/2000 |
| JP | 2004087953 A | 3/2004 |

* cited by examiner

*Primary Examiner* — Kiesha R Bryant
*Assistant Examiner* — Minchul Yang
(74) *Attorney, Agent, or Firm* — Hovey Williams LLP

(57) ABSTRACT

An electromagnetic shielding device in an infrared receiver comprises of a wiring frame (4) of metal and an electromagnetic shielding cover (1) of metal. There is a window (2) in the electromagnetic shielding cover (1), in which there is provided a shielding net (3). The electromagnetic shielding cover (1) has a protruding tongue (6) in the bottom of its both sides respectively and the protruding tongues (6) are bent downwards and entad to engage on the wiring frame (4), thus forming an electromagnetic shielding structure transparent to a chip inside. The electromagnetic shielding device of the present invention is simple in structure, reasonable in design, easy to manufacture, low-cost, high qualified ratio and thus suitable for mass productivity. The electromagnetic shielding device improves the electromagnetic interference preventive capability of a semiconductor element and thus increases the sensibility and reliability of an infrared receiver.

5 Claims, 6 Drawing Sheets

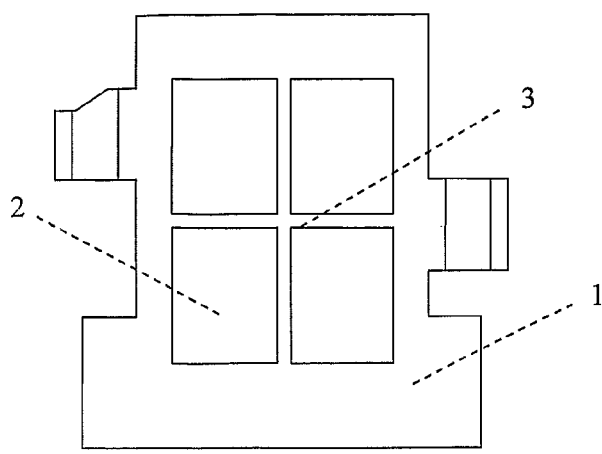
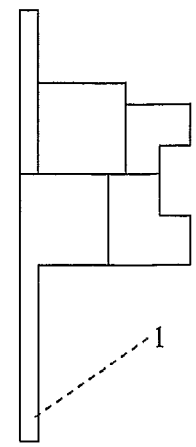
Fig. 1
Fig. 2
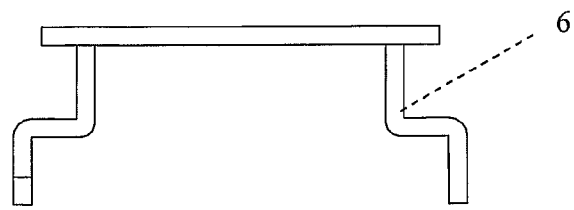
Fig. 3
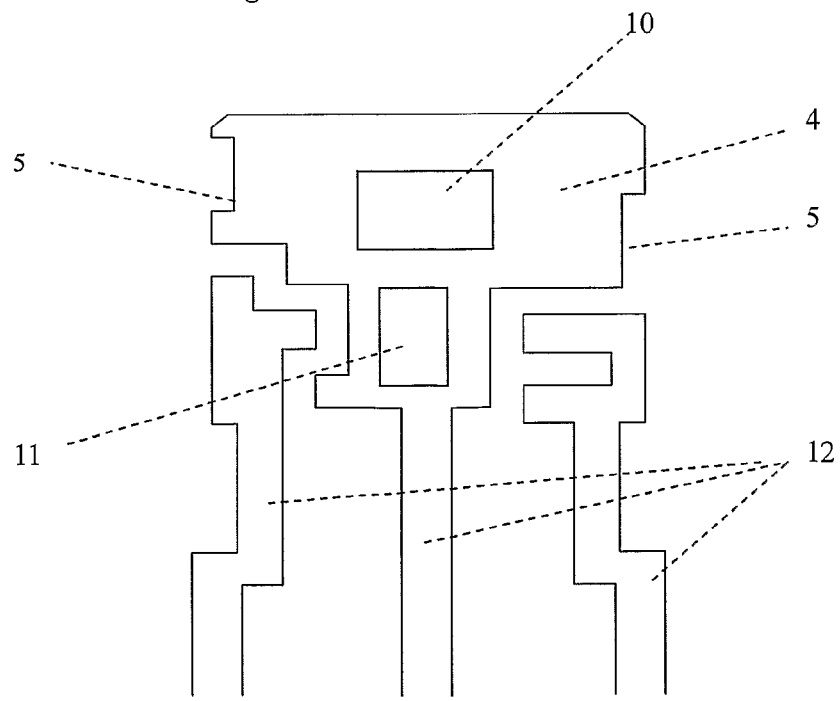
Fig. 4

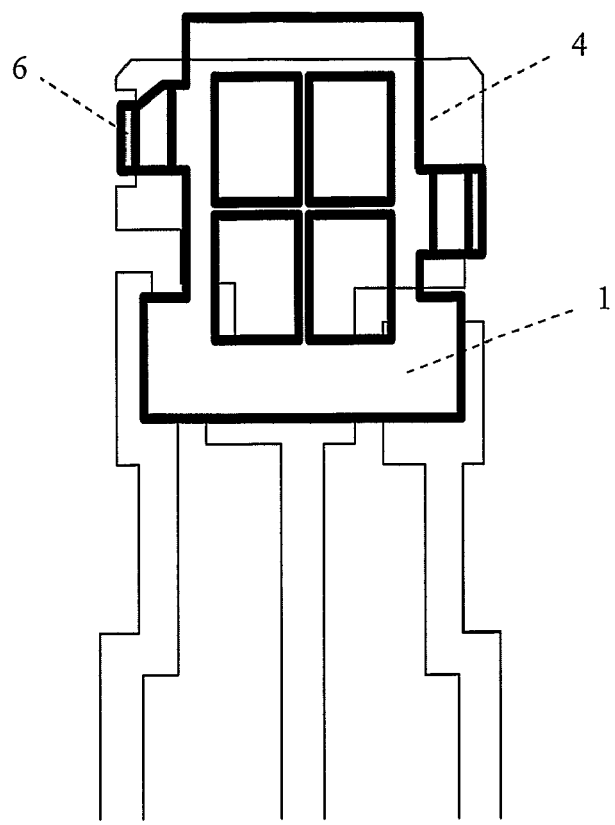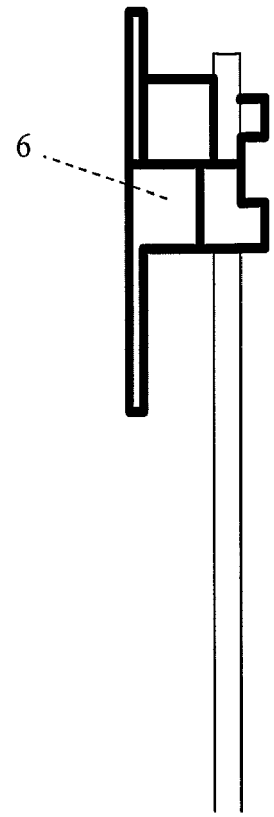
Fig. 5          Fig. 6
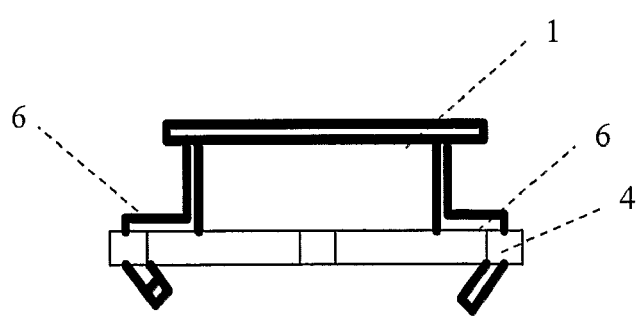
Fig. 7

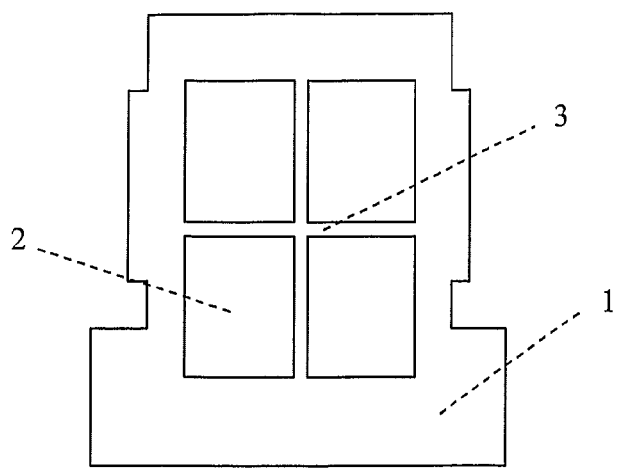
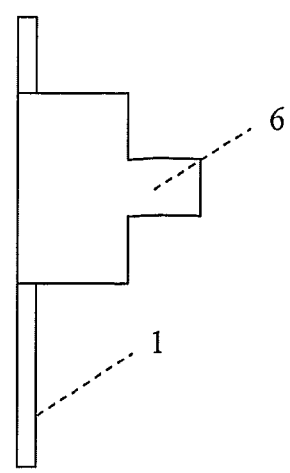
Fig. 8               Fig. 9
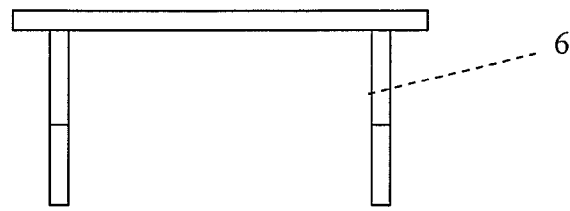
Fig. 10
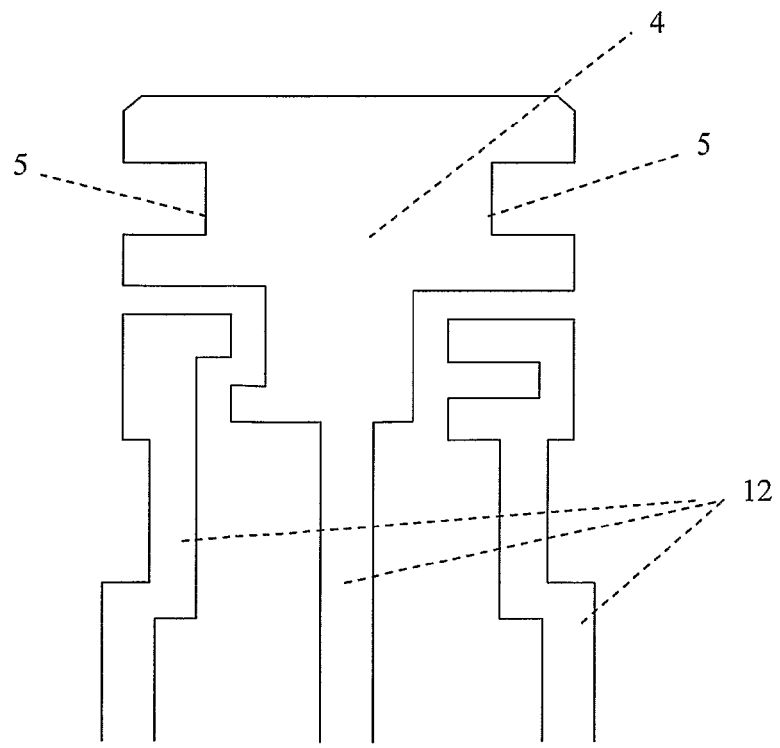
Fig. 11

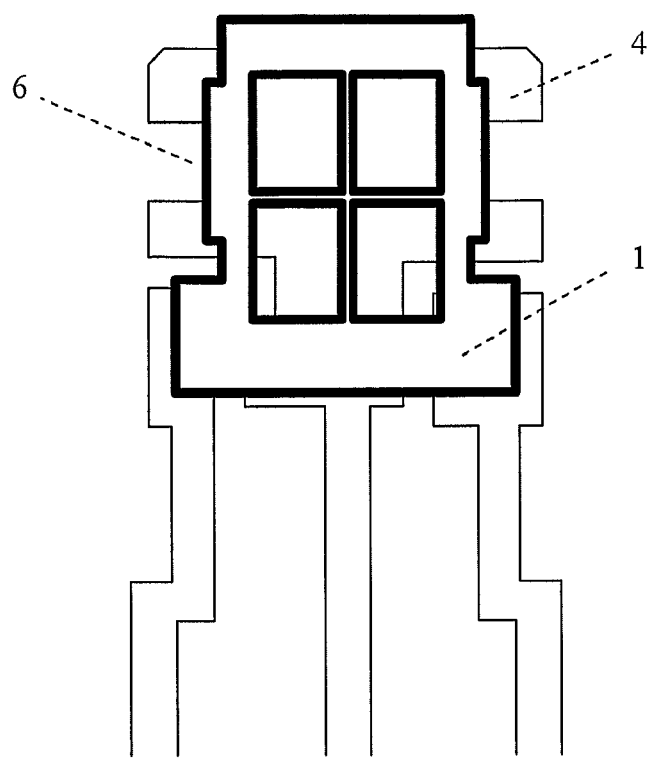
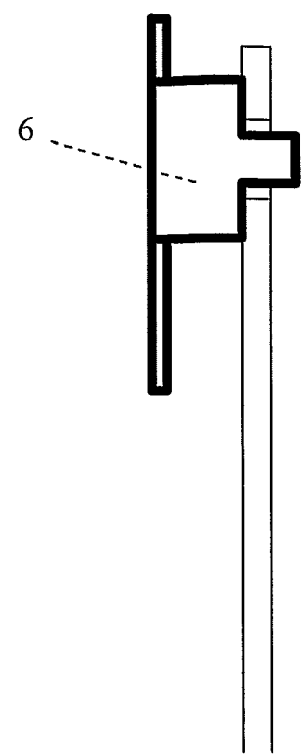
Fig. 12                    Fig. 13
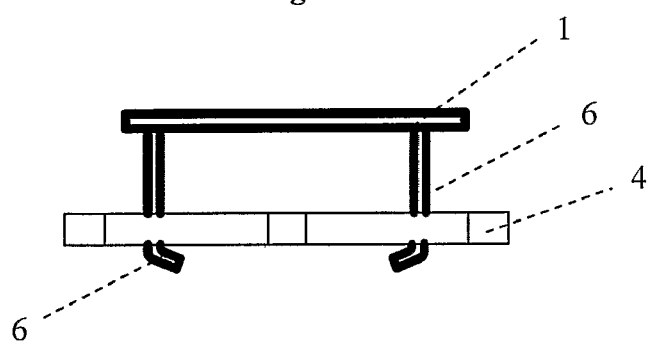
Fig. 14

ELECTROMAGNETIC SHIELDING DEVICE FOR AN INFRARED RECEIVER

This application claims priority to PCT International Application No. PCT/CN2006/003120, filed Nov. 20, 2006, which claims priority to Chinese Patent Application No. 200520022019.2, filed Nov. 25, 2005, and Chinese Patent Application No. 200620020197.6, filed Feb. 13, 2006. Each of these priority applications is expressly incorporated by reference herein in its entirety.

FIELD OF THE INVENTION

The present invention relates to a device for realizing electromagnetic shielding inside a semiconductor optoelectronic element, and more particularly to an electromagnetic shielding device inside an infrared receiver.

BACKGROUND OF THE INVENTION

An infrared receiver is a fundamental device for realizing the remote control function of household electrical appliances, but the normal operation of the infrared receiver is influenced by external electromagnetic interference due to its high internal gain. To overcome the adverse influence produced by the electromagnetic interference, it is necessary to provide an electromagnetic shielding device inside the infrared receiver. The present inventor has conducted a long-term research and experiment on the above issue, and has designed and proposed a novel technical solution. Based on this technical solution, the present inventor has filed a patent application in early 2003, which was granted on Apr. 7, 2004 under Patent No. ZL03211316.1. The present application is made on the optimization and improvement of the above inventive patent, and is more reasonable in design, is easy to manufacture, and has higher engineering operability.

SUMMARY OF THE INVENTION

The object of the present invention is to provide an electromagnetic shielding device for an infrared receiver, which is easier to manufacture, low-cost, high qualified ratio and suitable for mass production.

According to one aspect of the present invention, there is provided an electromagnetic shielding device within an infrared receiver, which comprises a wiring frame of metal and an electromagnetic shielding cover of metal. There is in the electromagnetic shielding cover a window in which there is provided a shielding net. The electromagnetic shielding cover has a protruding tongue in the bottom of its two sides respectively, and the protruding tongues are bent downwards and inwardly to engage on the wiring frame, thus forming an electromagnetic shielding structure transparent to a chip inside.

The wiring frame can be of pure metal, and can also be other types of wiring frames such as copper-coated plate, metallized ceramic, and the like.

The wiring frame is formed with two positioning notches on both of its two sides, and the protruding tongues are engaged on the positioning notches. Herein, the window includes a plurality of windows, and the shielding net consists of a plurality of intersecting beams. Herein, the beams are structurally integral with the electromagnetic shielding cover, or any other structure attached to the electromagnetic shielding cover. Herein, the protruding tongues are in a flat shape. Each of the protruding tongues has two bends.

According to another aspect of the present invention, there is provided an electromagnetic shielding device within an infrared receiver, which comprises a wiring frame, a semiconductor chip mounted on the wiring frame, and an electromagnetic shielding cover of metal. Herein, there is a window in the electromagnetic shielding cover, and there is provided a shielding net in the window. Herein, the electromagnetic shielding cover has "n" shape protruding lugs in the bottom of its both sides respectively, and each "n" shape protruding lug has a longer leg and a shorter leg at the lower part. The longer leg is bent toward the shorter leg side to engage on the wiring frame, thus forming an electromagnetic shielding structure transparent to the chip(s) inside.

The electromagnetic shielding cover has a tongue-shaped part at the lower part, which is connected with an "L" shape slot of the wiring frame. Herein, the wiring frame has two positioning notches on the upper part, and the "n" shape protruding lugs are engaged on the positioning notches. Herein, the window includes a plurality of windows, and the shielding net consists of a plurality of intersecting beams. Herein, the beams are structurally integral with the electromagnetic shielding cover, or are any other structure attached to the electromagnetic shielding cover. Herein, the longer legs in the bottom of both sides of the electromagnetic shielding cover are located on the opposite sides, or on the same sides, of the positioning notches.

The electromagnetic shielding device according to the present invention has the advantages of being simple in structure, reasonable in design, easy to manufacture, low-cost, high qualified ratio and thus suitable for mass productivity. The electromagnetic shielding device improves the electromagnetic interference preventive capability of a semiconductor element, and thus significantly increases the sensibility and reliability of an infrared receiver.

BRIEF DESCRIPTION OF THE DRAWING

FIG. 1 is a front view of an electromagnetic shielding cover according to the first embodiment of the present invention;

FIG. 2 is a right side view of an electromagnetic shielding cover according to the first embodiment of the present invention;

FIG. 3 is a top view of an electromagnetic shielding cover according to the first embodiment of the present invention;

FIG. 4 is a front view of a wiring frame according to the first embodiment of the present invention;

FIG. 5 is a front view showing the implementation of the first embodiment of the present invention;

FIG. 6 is a right side view showing the implementation of the first embodiment of the present invention;

FIG. 7 is a top view showing the implementation of the first embodiment of the present invention;

FIG. 8 is a front view of an electromagnetic shielding cover according to the second embodiment of the present invention;

FIG. 9 is a right side view of an electromagnetic shielding cover according to the second embodiment of the present invention;

FIG. 10 is a top view of an electromagnetic shielding cover according to the second embodiment of the present invention;

FIG. 11 is a front view of a wiring frame according to the second embodiment of the present invention;

FIG. 12 is a front view showing the implementation of the second embodiment of the present invention;

FIG. 13 is a right side view showing the implementation of the second embodiment of the present invention;

FIG. 14 is a top view showing the implementation of the second embodiment of the present invention;

DESCRIPTION OF THE PREFERRED EMBODIMENTS

Figures 15, 16, 17:
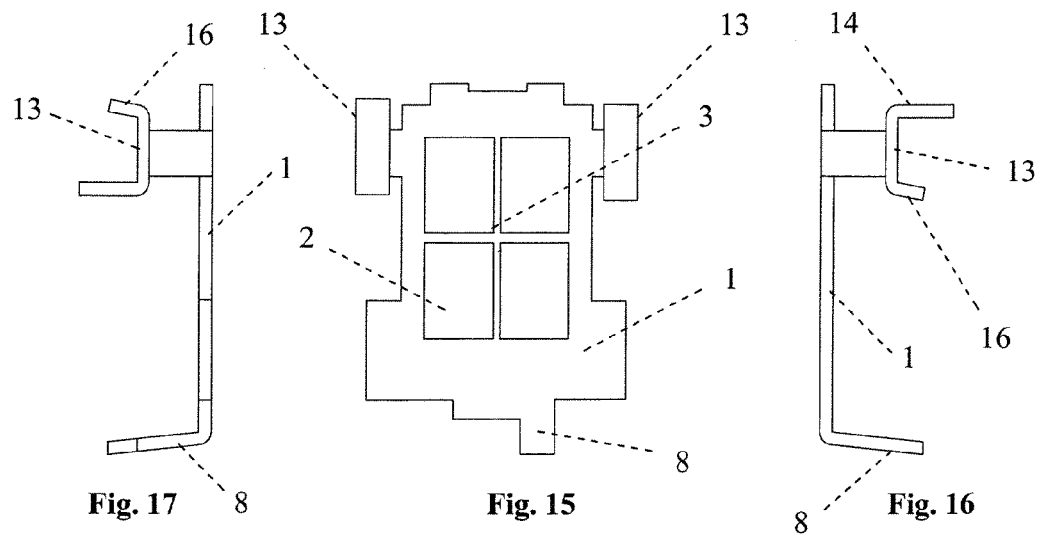
FIG. 15 is a front view of an electromagnetic shielding cover according to the third embodiment of the present invention.
FIG. 16 is a right side view of an electromagnetic shielding cover according to the third embodiment of the present invention.
FIG. 17 is a left side view of an electromagnetic shielding cover according to the third embodiment of the present invention.
Figure 18:
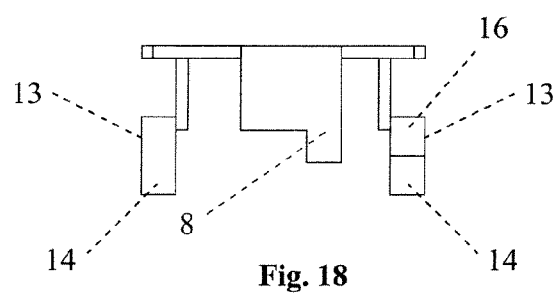
FIG. 18 is a bottom view of an electromagnetic shielding cover according to the third embodiment of the present invention.

The embodiments of the present invention will be described in detail by reference to the accompanying drawings.

The First Embodiment

With reference to FIGS. 1 to 3, according to the first embodiment of the present invention, there is a window 2 in the electromagnetic shielding cover 1, and a shielding net 3 is provided in the window 2. The electromagnetic shielding cover 1 has a protruding tongue 6 in the bottom of each of its two sides respectively. The protruding tongues 6 have two bends of 90° respectively, and are in a trapezoid shape.

With reference to FIG. 4, a wiring frame 4 is formed with two positioning notches 5 on its both sides. A receiving diode chip 10 and an IC chip 11 are mounted in the wiring frame 4. Herein, the receiving diode chip 10 and the IC chip 11 are connected with functional circuits of the household electrical appliances, etc. via leads 12. The wiring frame 4 can be of pure metal, and can also be other types of wiring frames of copper-coated plate, metallized ceramic, and the like.

With reference to FIGS. 5 to 7, the two protruding tongues 6 of the electromagnetic shielding cover 1 are engaged with the two positioning notches 5 of the wiring frame 4. The protruding tongues 6 are bent downwards and inwardly to engage on the wiring frame 4, thus forming an electromagnetic shielding structure transparent to the chips 10 and 11 positioned inside.

In the first embodiment of the present invention, the horizontal and longitudinal beams forming the shielding net 3 can be structurally integral with the electromagnetic shielding cover 1, and can also be any other structure attached to the electromagnetic shielding cover 1 by processes well-known to those skilled in the art.

In addition, the window 2 and the shielding net 3 are not limited to the forms discussed above. The window 2 can be divided into more windows with smaller size, and the shielding net 3 can also have more beams intersecting with each other in the horizontal and longitudinal directions.

Furthermore, the beams of the shielding net 3 which intersect with each other are not limited to intersection in the horizontal and longitudinal directions, but they can also intersect in oblique directions.

In the present invention, the bend of the protruding tongue is not limited to 90°, but it can be of any other angle that can fix the electromagnetic shielding cover 1 to the wiring frame 4. For example, the angle may be within a range of 30° to 150°.

The Second Embodiment

With reference to FIGS. 8 to 10, according to the second embodiment of the present invention, there is a window 2 in the electromagnetic shielding cover 1, and a shielding net 3 is provided in the window 2. The electromagnetic shielding cover 1 has a protruding tongue 6 in the bottom of each of its two sides respectively. The protruding tongues 6 have no bends and are in a planar shape.

With reference to FIG. 11, the wiring frame 4 is formed with two positioning notches 5 on its both sides. A receiving diode chip and an IC chip (which are similar with those in the first embodiment and are not shown here) are mounted in the wiring frame 4. Herein, the receiving diode chip and the IC chip are connected with functional circuits of the household electrical appliances, etc. via leads 12. The wiring frame 4 can be of pure metal, and can also be other types of wiring frames of copper-coated plate, metallized ceramic, and the like.

With reference to FIGS. 12 to 14, the two protruding tongues 6 of the electromagnetic shielding cover 1 are engaged with the two positioning notches 5 of the wiring frame 4. The protruding tongues 6 are bent downwards and inwardly to engage on the wiring frame 4, thus forming an electromagnetic shielding structure transparent to the chips inside.

In the second embodiment of the present invention, the horizontal and longitudinal beams forming the shielding net 3 can be structurally integral with the electromagnetic shielding cover 1, and can also be any other structure attached to the electromagnetic shielding cover 1 by processes well-known to those skilled in the art.

In addition, the window 2 and the shielding net 3 are not limited to the forms discussed above. The window 2 can be divided into more windows with smaller size, and the shielding net 3 can also have more beams intersecting with each other in the horizontal and longitudinal directions.

Furthermore, the beams of the shielding net 3 which intersect with each other are not limited to intersection in the horizontal and longitudinal directions, but they can also intersect in oblique directions.

The Third Embodiment

With reference to FIGS. 15 to 18, according to the third embodiment of the present invention, there is a window 2 in the metal electromagnetic shielding cover 1, and a shielding net 3 is provided in the window 2. The metal electromagnetic shielding cover 1 has "n" shape protruding lugs 13 in the bottom of its both sides respectively. The "n" shape protruding lugs 13 branch into a longer leg 14 and a shorter leg 16. The longer leg 14 bends toward the shorter leg 16 to engage on the wiring frame 4. In addition, the metal electromagnetic shielding cover has in its bottom a tongue-shaped part 8.

Figure 19:
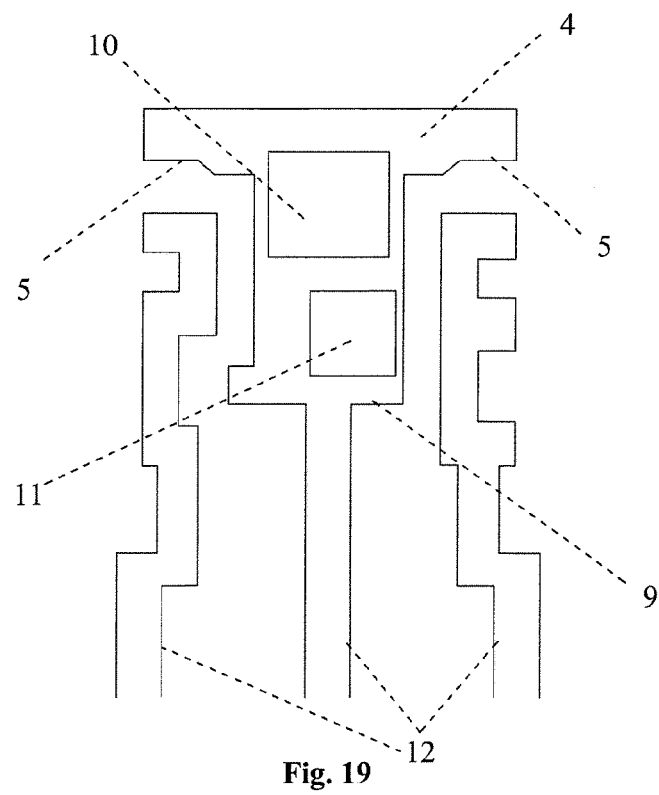
FIG. 19 is a front view showing a wiring frame of the third embodiment of the present invention.
Figures 20, 21, 22, 23:
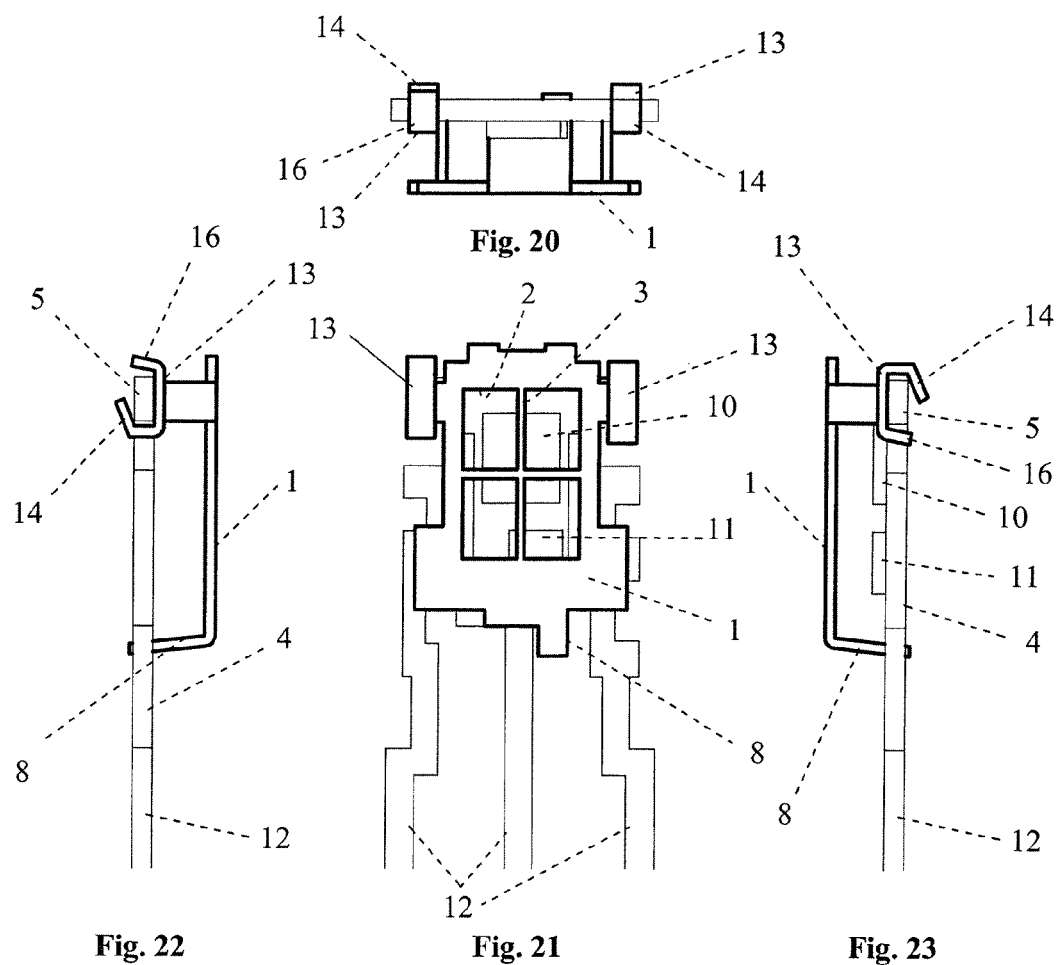
FIG. 20 is a top view showing the implementation of the third embodiment of the present invention.
FIG. 21 is a front view showing the implementation of the third embodiment of the present invention.
FIG. 22 is a left side view showing the implementation of the third embodiment of the present invention.
FIG. 23 is a right side view showing the implementation of the third embodiment of the present invention.
Figure 24:
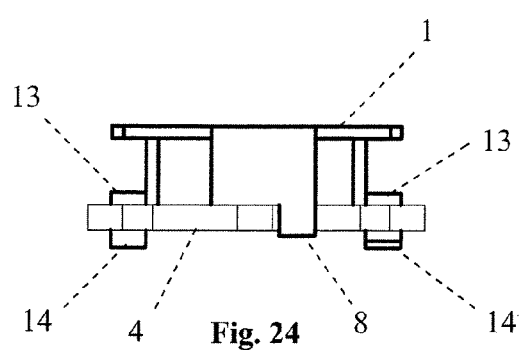
FIG. 24 is a bottom view showing the implementation of the third embodiment of the present invention.

With reference to FIG. 19, the wiring frame 4 is formed with two positioning notches 5 on its upper sides for fixing the "n" shape protruding lugs 13 of the electromagnetic shielding cover 1. There is an "L" shape slot 9 in the center of the wiring frame 4, which engages with the tongue-shaped part 8 of the electromagnetic shielding cover 1 to position the electromagnetic shielding cover 1. A receiving diode chip and an IC chip are mounted in the wiring frame 4. The receiving diode chip and the IC chip are connected with functional circuits of the household electrical appliances, etc. via leads 12. The wiring 4 can be of pure metal, and can also be other types of wiring frames of copper-coated plate, metallized ceramic, and the like.

With reference to FIGS. 20 to 24, the two longer legs 14 of the metal electromagnetic shielding cover 1 are engaged with the two positioning notches 5 of the wiring frame 4. During assembling, the longer legs 14 are bent toward the shorter legs 16 to engage on the wiring frame 4, and the tongue-shaped part 8 of the metal electromagnetic shielding cover 1 is engaged with the "L" shape slot 9 of the wiring frame 4. As a result, an electromagnetic shielding structure transparent to the chip 10 and chip 11 inside is formed.

As shown in FIGS. 16 and 17, the longer legs 14 of the two "n" shape protruding lugs 13 for the electromagnetic shielding cover 1 are provided at opposite sides, to facilitate firmly fixing the electromagnetic shielding cover 1 to the wiring frame 4.

In addition, in the third embodiment of the present invention, the longer legs 14 of the two "n" shape protruding lugs 13 for the electromagnetic shielding cover 1 can be long enough so as to wrap the positioning notches 5 of the wiring frame 4 one cycle, i.e. to enclose the positioning notches 5 in a closed structure formed by the longer legs 14 and the shorter legs 16. In this manner, the longer legs 14 of the two "n" shape protruding lugs 13 can be provided at the same side (not shown), i.e. the longer legs 14 can be both at the upper side of the "n" shape protruding lugs 13, or both at the lower side of the "n" shape protruding lugs 13.

Furthermore, in the third embodiment of the present invention, the horizontal and longitudinal beams forming the shielding net 3 can be of structure integral with the electromagnetic shielding cover 1, and can also be any other structure attached to the electromagnetic shielding cover 1 by processes well-known to those skilled in the art.

In addition, the window 2 and the shielding net 3 are not limited to the forms discussed above. The window 2 can be divided into more windows with smaller size, and the shielding net 3 can also have more beams intersecting with each other in the horizontal and longitudinal directions.

Furthermore, the beams of the shielding net 3 which intersect with each other are not limited to intersection in the horizontal and longitudinal directions, but they can also intersect in oblique directions.

In the third embodiment of the present invention, the bends of the two legs 14 and 16 for the "n" shape protruding lugs 13 can be of any angle that can fix the electromagnetic shielding cover 1 to the wiring frame 4. For example, the angle may be within a range of 30° to 150°.

The electromagnetic shielding device of the present invention is simple in structure, reasonable in design, easy to manufacture, low-cost, high qualified ratio and thus suitable for mass productivity. The electromagnetic shielding device improves the electromagnetic interference preventive capability of a semiconductor element and thus increases the sensibility and reliability of the infrared receiver.

Although the specific descriptions are provided for the embodiments of the present invention, they are not exhaustive and the invention is not limited to those disclosed forms. Based on the above description, those skilled in the art can make various modifications and/or changes without departing from the spirit and scope of the present invention.

What is claimed is:

1. An electromagnetic shielding device within an infrared receiver, the electromagnetic shielding device comprising a wiring frame, semiconductor chips mounted on the wiring frame, and an electromagnetic shielding cover having opposite sides, a bottom, a lower part and an upper part, wherein the electromagnetic shielding cover comprises a window, a shielding net provided in the window, an "n" shape protruding lug at the bottom at both sides of the electromagnetic shielding cover, and a tongue-shaped part at the lower part of the electromagnetic shielding cover, wherein each "n" shape protruding lug has a leg bent to engage on the wiring frame and the tongue-shaped part is engaged on and directly contacts an "L" shape slot of the wiring frame, thus forming an electromagnetic shielding structure transparent to the chips inside.

2. The electromagnetic shielding device according to claim 1, wherein the wiring frame has two positioning notches on the upper part, and the "n" shape protruding lugs are engaged on the positioning notches.

3. The electromagnetic shielding device according to claim 1, wherein the window includes a plurality of windows, and the shielding net consists of a plurality of intersecting beams.

4. The electromagnetic shielding device according to claim 3, wherein the beams are structurally integral with the electromagnetic shielding cover.

5. The electromagnetic shielding device according to claim 1, wherein each of the "n" shape protruding lugs has a longer leg and a shorter leg and wherein the longer legs are located on opposite sides, or on the same sides, of the positioning notches.

* * * * *